Sept. 29, 1959 W. P. MASON 2,906,973

ELECTROSTRICTIVE CERAMICS COMPRISING A PRINCIPAL COMPONENT OF BARIUM TITANATE

Filed April 29, 1953 5 Sheets-Sheet 1

INVENTOR
W. P. MASON
BY Hugh S. Wertz
ATTORNEY

Sept. 29, 1959 W. P. MASON 2,906,973
ELECTROSTRICTIVE CERAMICS COMPRISING A
PRINCIPAL COMPONENT OF BARIUM TITANATE
Filed April 29, 1953 5 Sheets-Sheet 2

INVENTOR
W. P. MASON
BY Hugh S. Wertz
ATTORNEY

Sept. 29, 1959 W. P. MASON 2,906,973
ELECTROSTRICTIVE CERAMICS COMPRISING A PRINCIPAL COMPONENT OF BARIUM TITANATE
Filed April 29, 1953 5 Sheets-Sheet 3

INVENTOR
W. P. MASON
BY Hugh S. Wertz
ATTORNEY

Sept. 29, 1959 W. P. MASON 2,906,973
ELECTROSTRICTIVE CERAMICS COMPRISING A PRINCIPAL COMPONENT OF BARIUM TITANATE
Filed April 29, 1953 5 Sheets-Sheet 4
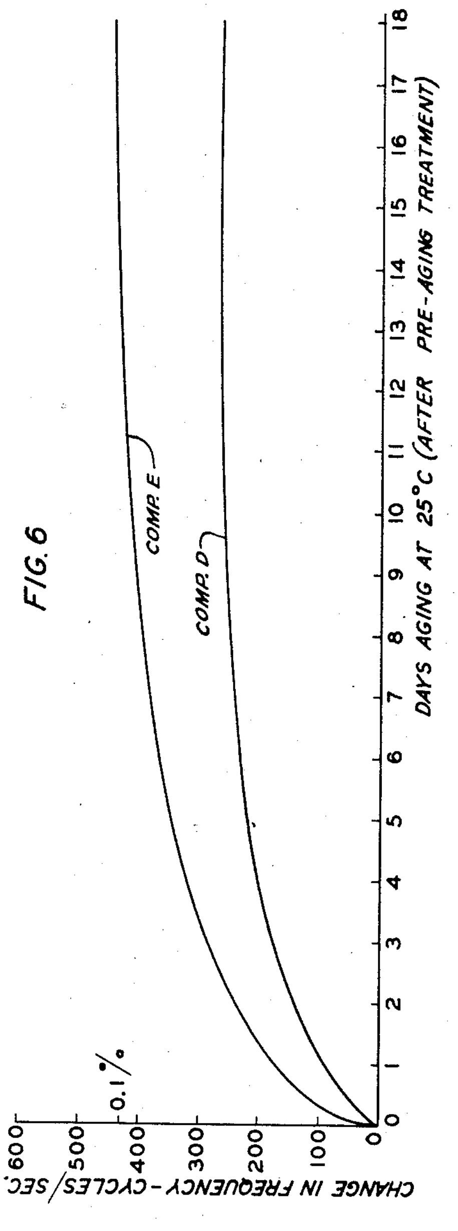
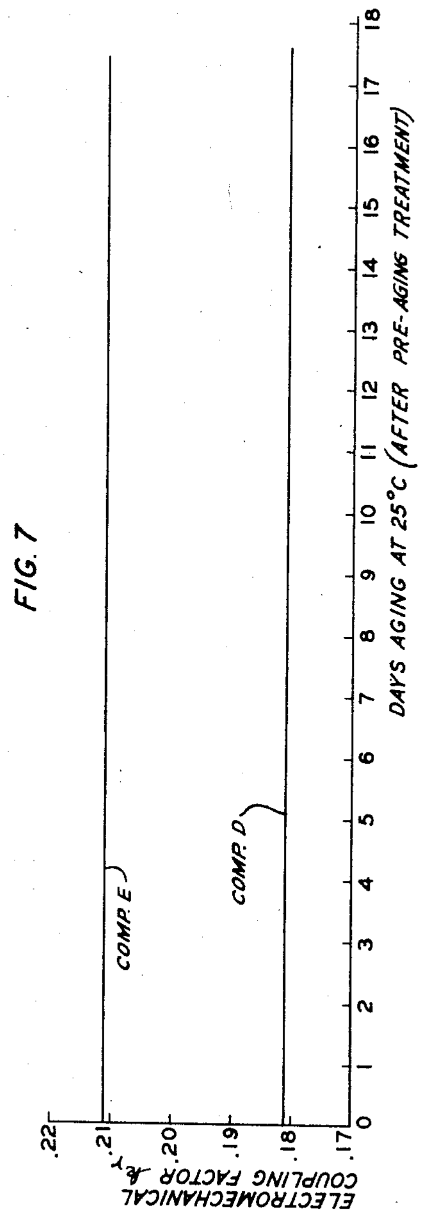
INVENTOR
W. P. MASON
BY *Hugh S. Wertz*
ATTORNEY INVENTOR
W. P. MASON
BY Hugh S. Wertz
ATTORNEY

United States Patent Office 2,906,973

Patented Sept. 29, 1959

2,906,973

ELECTROSTRICTIVE CERAMICS COMPRISING A PRINCIPAL COMPONENT OF BARIUM TITANATE

Warren P. Mason, West Orange, N.J., assignor to Bell Telephone Laboratories, Incorporated, New York, N.Y., a corporation of New York Application April 29, 1953, Serial No. 351,843

7 Claims. (Cl. 333—72)

This invention relates to materials comprising as a principal component barium titanate, and more particularly to such materials having low temperature coefficients of frequency and capacity.

In extended electrical circuits such as, for example, rural carrier telephone systems, in which a large number of filter and delay elements are used, mechanically vibrating elements may be advantageously substituted for conventional electrical elements, principally because the vibrating elements are more compact, efficient, and economical to manufacture. For such applications, piezoelectric ceramic materials are commonly employed, comprising as a principal component, for example, barium titanate. Among the designs which have been found to be particularly suitable for filters are those which employ a resonant piezoelectric element vibrating in the torsional mode.

In accordance with certain design specifications for such torsional mechanical filters, particularly those having attached delay lines, it is desirable to make the driver and mechanical parts in one continuous piece in order to avoid the use of glued or soldered joints. For such types of construction in mechanical filters or delay lines, the parameters of the material should be sufficiently stable with temperature and time so that the filter characteristics or delay times for applied signals remain in each case within a prescribed operating range. For many types of filters, this requires a frequency stability of 0.1 percent in the temperature range from 55° F. to 110° F., and for all filters, a stability of better than one percent. Ordinary commercial barium titanate, and certain prior art compositions including barium titanate have temperature frequency characteristics that are outside of this range by a considerable margin.

It is therefore the principal object of the present invention to provide improved compositions comprising a principal component of barium titanate for use in filters, delay lines, and transducers; and more specifically, compositions characterized by exceedingly low temperature coefficients of resonant frequency in combination with relatively high figures of merit or "Q's" and good mechanical coupling contentants.

Process steps for rapidly "pre-aging," that is, expediting the "aging" of the prepared ceramic materials so that their useful characteristics are promptly stabilized, as disclosed and originally claimed in the present application, have been made the subject matter of applicant's divisional application, Serial No. 733,679, filed May 7, 1958.

In accordance with the present invention, the above and other objects are realized in a series of compositions consisting of a principal component of barium titanate combined with 3 to 8 percent of calcium titanate and 4 to 12 percent of lead titanate, which compositions are characterized by variations of less than one-tenth of one percent in the temperature coefficient of resonant frequency over the usual indoor temperature range, and which are characterized by figures of merit or Q's ranging from 1200 to 1500, which are indicative of the sharpness of the resonance.

The stability characteristics of the aforesaid materials are further improved by a novel "pre-aging" or expedited aging technique described and claimed in my above-mentioned divisional application in which the ceramics under preparation are heat-treated for extended periods subsequent to poling, in several graduated temperature steps below the curie temperature, which is that transition temperature above which a crystal ceases to exhibit piezoelectric and ferroelectric properties. A further improvement in the expedited aging technique involves applying to the ceramics under heat treatment a potential of the same sign as, and approximately one-half, the poling potential.

Other objects and features will be apparent from a study of the specification hereinafter and the attached drawings, in which:

Fig. 1 shows a plot of Young's modulus against temperature in degrees centigrade for commercial barium titanate and four of the disclosed compositions;

Figs. 2, 3, 4, and 5 are, respectively, aging curves over a period of nearly a year for frequency change, coupling, dielectric constant, and figure of merit or "Q" for selected ones of the disclosed compositions;

Figs. 6 and 7 are aging curves after heat treatment for frequency change and coupling of the same selected compositions;

Figure 1:
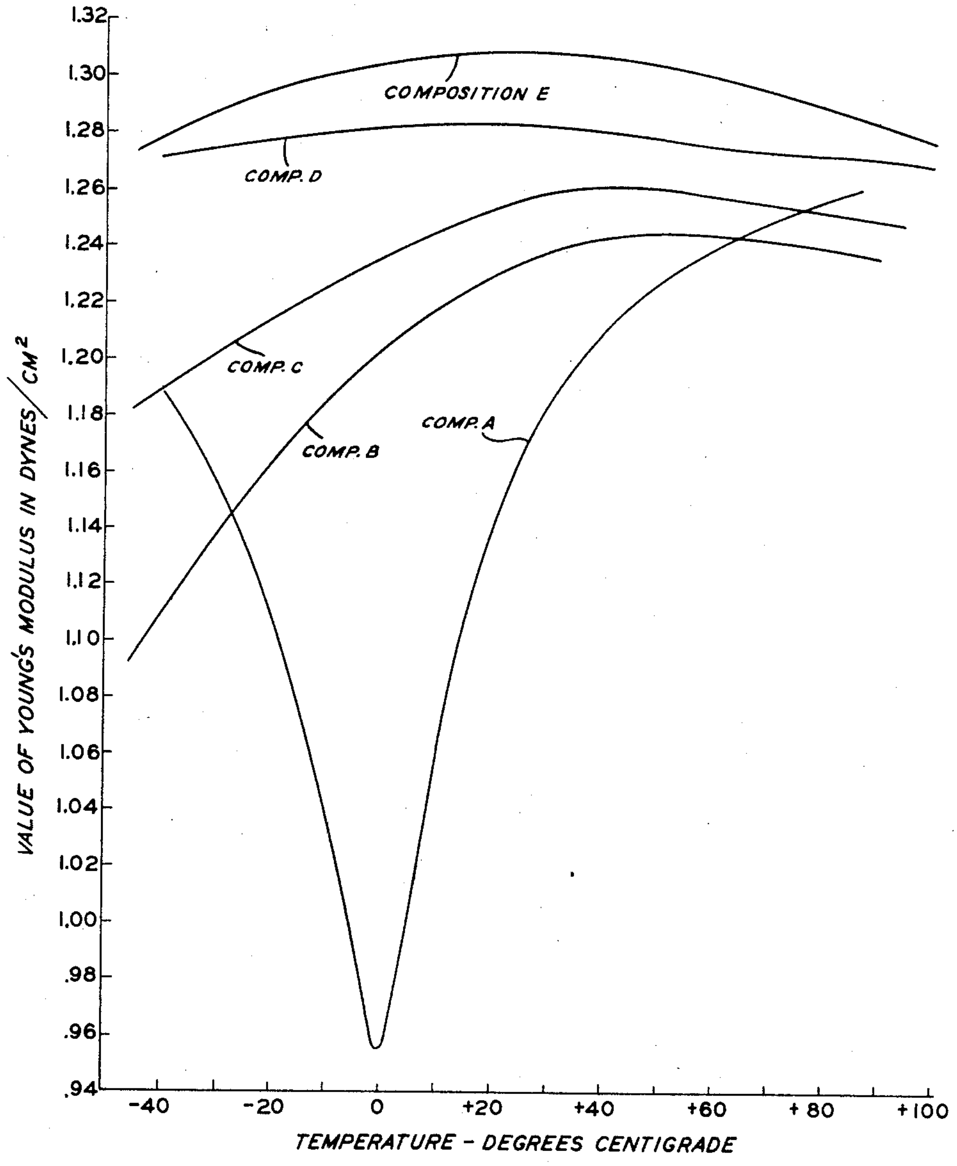
Figure 2:
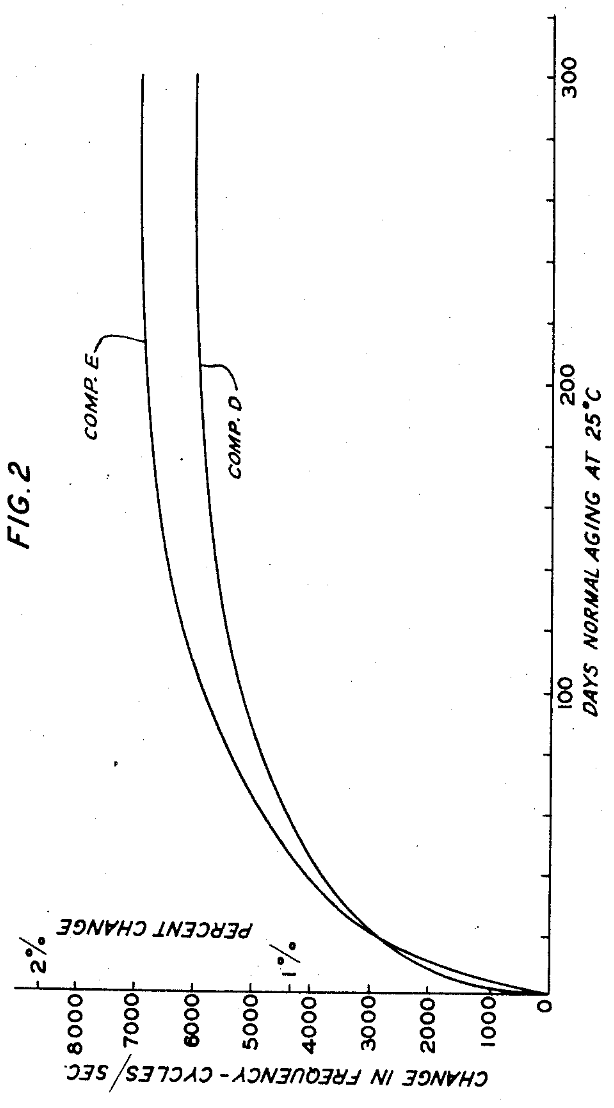
Figure 3:
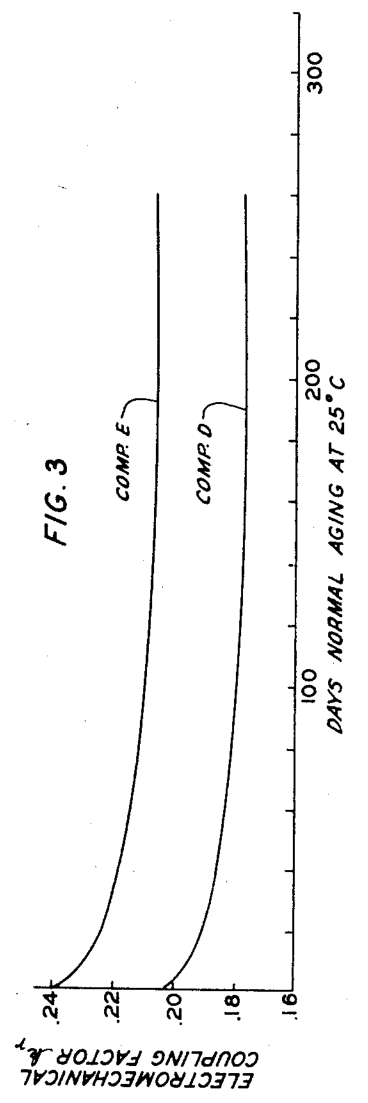
Figure 4:
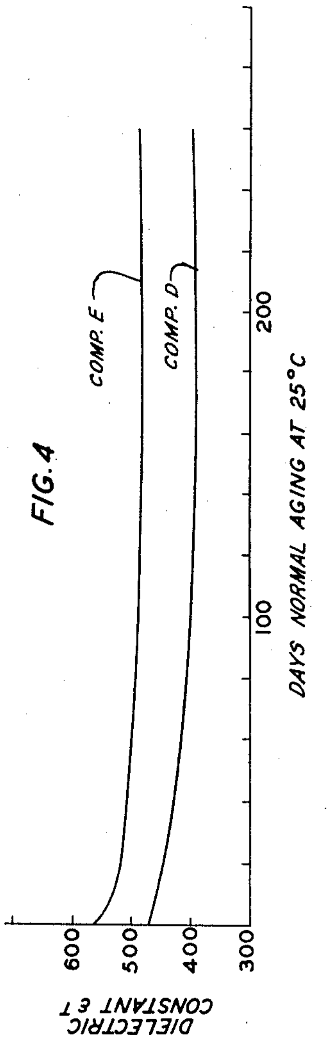
Figure 5:
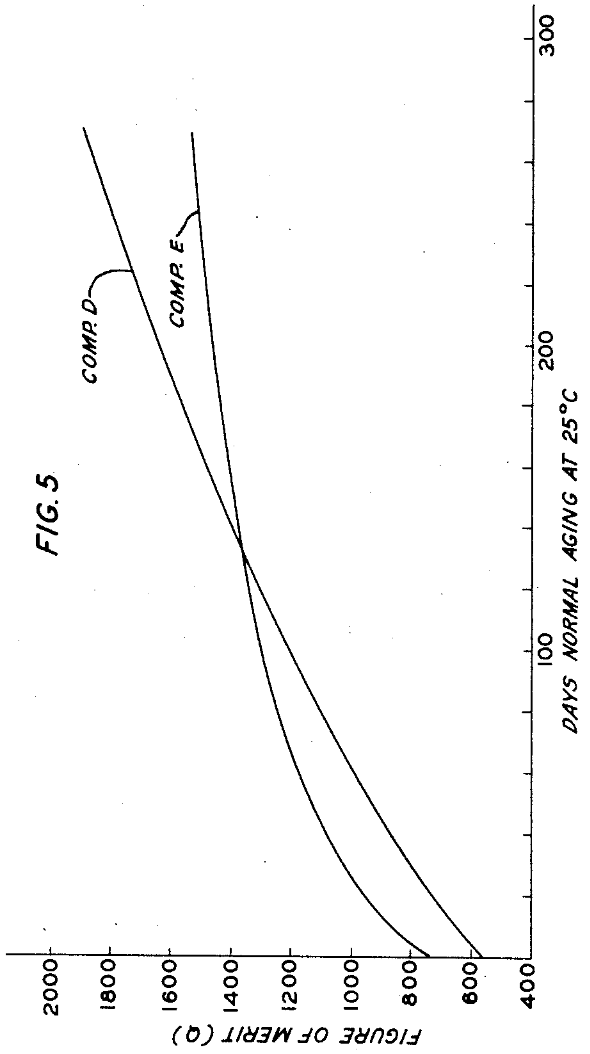

The process of making a ceramic in accordance with the present invention is as follows. Assuming that the end product is to contain, for example, 8 percent lead titanate, 2.7 percent calcium titanate, and 89.3 percent barium titanate, corresponding quantities of commercial grades of these components, having a fineness of, for example, 325 mesh, are first wet-mixed in a ball mill, after which a binder is added. The binder may comprise any one of a large number of binder materials well known in the art, the only restriction being that the binder be of such a composition that it does not react chemically with any of the other components. In the present illustrative example, 4 percent by weight of wax emulsion No. 1214, a product of the Union Carbide and Carbon Corporation, is utilized. From the mixture including the binder, wafers are formed in metal molds three-eighths of an inch in diameter, and 60 mils thick, under pressures of from 2 to 10 thousand pounds per square inch, in a hydraulic press. The pressed wafers are then fired in an oxidizing atmosphere at temperatures within the range 1275° C. to 1400° C., in any well known type of electrical furnace having a silicon carbide heater for the removal of organic binder materials. The temperature in the furnace may be raised, for example, at the rate of 200° C. per hour. The oxidizing atmosphere can be readily obtained, for example, by having loosely fitting doors or enclosures, and holes in the exterior to admit air. After the furnace temperature has been raised to its maximum within the stated range, it is allowed to cool slowly to room temperature.

To pole the wafers electrically, fired-on silver electrodes, or any other type well known in the art, are applied to form conducting films on their opposite major faces. During the poling process, a field of, for example, 30 volts per mil, is applied across the electrodes as the wafer is heated up above the curie point. The field is then removed, and the wafer allowed to cool again to room temperature.

By actual trials it has been shown that by incorporating both lead titanate and calcium titanate into a barium titanate mix, it is possible to produce a ceramic material which reaches a maximum resonant frequency at 25° C. and exhibits a parabolic variation of frequency with temperature which does not exceed 0.1 percent from 13° C. to 44° C. (55° F. to 110° F.), the usual indoor temperature range. Two mixes, compositions D and E indicated in the table below, have been found which meet this requirement. Of these two mixes, the first has the higher dielectric constant, and the larger electromechanical coupling factor, while the latter has the flatter temperature frequency curve. The term "electromechanical coupling factor," which will be used frequently hereinafter, is defined as the square root of the ratio of the energy stored in mechanical form for a given type of displacement to the total input electrical energy obtained from the input battery. Compositions D and E also have dielectric constants that change only about 6 percent over the temperature range mentioned, and a mechanical Q of 600 to 700, where Q represents the ratio of reactance to resistance in the element. This figure is considerably higher than has been obtained with other barium titanate compositions.

Typical compositions considered in accordance with the present invention are indicated in the following table.

*Table I*

| No. | Compositions (By Weight) (Approximate) |
|---|---|
| A | $BaTiO_3$. |
| B | 4% $PbTiO_3$; 5.7% $CaTiO_3$; 90.3% $BaTiO_3$. |
| C | 8% $PbTiO_3$; 5.4% $CaTiO_3$; 86.6% $BaTiO_3$. |
| D | 12% $PbTiO_3$; 8.2% $CaTiO_3$; 79.8% $BaTiO_3$. |
| E | 8% $PbTiO_3$; 8.6% $CaTiO_3$; 83.4% $BaTiO_3$. |
| F | 8% $PbTiO_3$; 2.7% $CaTiO_3$; 89.3% $BaTiO_3$. |
| G | 12% $PbTiO_3$; 5.4% $CaTiO_3$; 82.6% $BaTiO_3$. |

All of the above-disclosed compositions, including barium titanate itself, are accompanied by an aging effect in which the resonant frequency increases from 0.5 to 2 percent in six months time, the dielectric constant decreases from 5 to 15 percent and the electromechanical coupling factor decreases from 3.5 percent to 15 percent, variations which are in general too large to be tolerated in filter or delay line structures. A fundamental study of this effect leads to the theory that it is a relaxation phenomenon connected with the domain structure inside the individual grains, since it is related to the transition through the Curie temperature. In the present specification, the term "domain" refers to the smallest dipole unit into which ferroelectric crystalline material can be subdivided. Every time a titanate composition of the type disclosed is heated up above the Curie temperature and repoled, the original constants are obtained and the aging starts all over again.

It has been found that if a poling field is applied while the ceramic is above its curie temperature, and the ceramic is then allowed to cool with the field still applied, a large part of the polarization is retained. Poling fields of the order of 35 volts per mil thickness of the ceramic produce a remanent polarization capable of yielding a coupling coefficient equal to 80 percent of that obtained with the originally applied field. Higher poling fields do not increase the remanent polarization sufficiently to justify their use.

Materials to be utilized in shear and torsional wave delay lines are so poled as to have the poling and driving fields perpendicular, whereas for longitudinal wave delay lines, the material is polarized so that the driving and poling fields are parallel. Illustrative electrode arrangements for poling ceramic structures comprising ferroelectric ceramics of the type disclosed will be found in my application Serial No. 351,841, filed at even date herewith. This application matured into Patent No. 2,742,614, granted April 17, 1956.

In accordance with the present invention aging effects, such as described in the foregoing paragraphs may be largely eliminated by the following technique. After the ceramic has been poled, it is placed in an oven controlled to a first temperature under 120° C. for a given length of time. This process increases the rapidity with which the domain walls move, thereby very materially reducing the aging times. The oven is then reduced to a second temperature, at which it is maintained for a given length of time. Several combinations of different temperatures and aging intervals have been found effective. Five days' treatment at 70° C. produces an increase of 1.7 percent in the resonant frequency of composition D and of 1.9 percent in composition E. After this aging cycle, a further cycle of treatment produces 0.185 percent resonant frequency increase at room temperature in the first composition, and 0.37 percent in the second, which stabilize to constant values after one month. A better aging cycle was found to be three days at 80° C. and three days at 50° C. After undergoing this cycle, composition D ages up only 0.06 percent while composition E ages up about 0.09 percent. This aging occurs at room temperature in about one week, and hence a fairly complete expedited aging of the ceramic can be accomplished in two weeks.

In accordance with one theory, the long aging time for these ceramics is caused by the high activation energy barrier that has to be surmounted when unit cells are rotated 90 degrees. In the case of the unpolarized ceramics when the temperature decreases through the curie temperature, domains are formed in all six directions inside a crystal grain. Due to irregular shapes and initial residual stresses, these domains are not all the same size, and consequently they have different final residual stresses. The ones with the higher residual stresses have the lowest free energy, and hence an equalization of stresses takes place by unit cells rotating 90 degrees or 180 degrees from the direction of adjacent domains in such a manner as to reduce the stresses. On account of the high activation energy, this process takes about six months at room temperature. During this process the dielectric constant decreases and the stiffness increases. When the ceramic is polarized, an additional motion of the domain walls occurs, thereby causing higher strains in the smaller size domains. These strains are also relieved by domain wall motion which progresses in such a direction as to reduce the locked in polarization, and reduce the effective piezoelectric constant. Experiments have been performed which show that initial residual strain aging is more important for frequency and dielectric constant aging, whereas polarizing strain boundary motions are more important for piezoelectric constant aging.

In the process of aging, the mechanical figure of merit, commonly known as the "Q," increases from about 700 to 1200 to 1500, and hence the resulting material makes a very satisfactory material for low amplitude signal delay lines and filters. The new compositions with the preaging technique compare in stability with −18° X-cut quartz crystals, which are now universally used in electrical wave filters.

The properties of interest in a barium titanate ceramic are the dielectric constant, the ratio of capacities of the ceramic used as a resonator, and the frequency of resonance, from which can be calculated the effective piezoelectric constant, the coefficient of coupling, and the elastic modulus. In testing these properties in compositions of the present invention, measurements were made on discs 0.787 centimeter in diameter and 0.152 centimeter thick vibrating in the radial mode. The resonant frequency of such a disc is related to Young's modulus, Poisson's ratio and density by the equation $$f_R=\frac{2.03}{2\pi a}\sqrt{\frac{Y_0}{\rho(1-\sigma^2)}} \qquad (1)$$

where $a$ is the radius of the disc, $Y_0$ is Young's modulus, $\rho$ the density and $\sigma$ is Poisson's ratio. The density is about 5.6 for all of these materials, and Poisson's ratio is 0.3 so that $$Y_0=\left(\frac{2\pi}{2.03}\right)^2\rho(1-\sigma^2)(f_Ra)^2=48.8(f_Ra)^2 \qquad (2)$$

The electromechanical coupling factor for a radial mode has been shown to be $$k_r^2=\frac{\Delta f}{f_R}\left(\frac{(2.03)^2-(1-\sigma^2)}{1+\sigma}\right)=2.47\frac{\Delta f}{f_R} \qquad (3)$$

where $\Delta f$ is the frequency separation between resonance and antiresonance. This coupling is $$\left(\frac{2}{1-\sigma}\right)$$

times that for a longitudinal mode driven by the same piezoelectric constant $d_{31}$. Since the constant $d_{31}$ is related to the longitudinal coupling factor $k_l$ by the equation $$d_{31}=k_l\sqrt{\frac{\epsilon^T}{4\pi}\times\frac{1}{Y_0}} \qquad (4)$$

all the constants can be calculated from measurements of the capacity at low frequencies, the resonant and antiresonant frequencies, and the resistance at resonance. The free dielectric constant is related to the low frequency capacity $C_0$ by the equation $$\epsilon^T=\frac{4\pi l_t C_0}{1.11A} \qquad (5)$$

when $C_0$ is measured in micromicrofarads, $l_t$ is the thickness of the ceramic in centimeters and A the cross-sectional area of the plate in square centimeters. The figure of merit, Q, of the ceramic can be obtained from the measured resistance at resonance from the equation $$Q=\frac{r}{2\pi f_R C_0 R} \qquad (6)$$

where $r$ is the ratio of capacities of the equivalent circuit of the crystal, given by $$r=\frac{f_R}{2\Delta f} \qquad (7)$$

and R is the measured resistance in ohms.

A number of discs, of a form described early in this specification were made up in each of a number of compositions within the disclosed ranges, and their resonant and antiresonant frequencies, resistances at resonance, and the capacitances at 1000 cycles measured. The discs which, as stated, were approximately 0.78 centimeter in diameter and 0.152 centimeter thick, were either plated by a conventional silver plate technique or by evaporation of a mixture of aluminum and gold which has a good adherence to barium titanate. The latter plating did not load the disc appreciably and was used in determining the exact elastic and piezoelectric constants. The compositions tried were those indicated in Table I.

The values for Young's modulus determined from the product of the frequency times the radius are plotted for five of these compositions in Fig. 1 of the drawings. The improvement of stability with increase in $PbTiO_3$ and $CaTiO_3$ content is marked. Two compositions, designated D and E, as indicated in Table I, have frequency-temperature curves that reach a maximum at 25° C. and show parabolic variations about this temperature. Over the temperature range from 13° C. to 43° C. the variation is in the order of 0.1 percent. Of these two, composition E produces the lesser variation, but it also has the smaller electromechanical coupling factor. This is shown by the fourth and fifth columns of Tables V and VI given hereinafter which give the radial and longitudinal coupling factors for radial and longitudinal length vibrations respectively. Columns 6 and 7 of these same two tables indicate that the dielectric constant $\epsilon^T$ and the piezoelectric constant $d_{31}$ decrease as the lead and calcium contents are varied. The recorded values in the last columns show that the mechanical figures of merit increase as the lead and calcium contents are varied. For the two compositions D and E the initial figures of merit are about 550 and 624, respectively. As discussed hereinafter, it is found that after aging, these figures of merit increase to 1200 or more, providing stable "high Q" elements that have considerably higher electromechanical coupling coefficients than can be found in most piezoelectric crystals.

All the values given in the Tables II to VIII given hereinafter were obtained by heating the specimens up to 140° C. in an oven heating a commercial grade of silicone oil up to the same temperature, immersing the specimen in the oil at this temperature, then applying a steady field of 31 volts per mil of thickness or the ceramic and leaving the field on as the ceramic cools through the curie temperature and down to 50° C. within an hour. The heating up of the ceramics before placing them in the hot oil prevents moisture from being trapped on the surface which, if present, may cause electrical breakdown.

Some tests were also made on ceramics polarized at 70° C. with a field of 40 volts per .001 inch thickness, with the results shown by Tables IX and X given hereinafter. The coupling for these ceramics is definitely lower than for those poled above the Curie temperature and furthermore the frequency constant is definitely lower. It appears that the elastic constant is somewhat dependent on how many domains are lined up in the direction of the poling. Hence, it appears desirable to pole every part of a ceramic entering into the motional part of a mechanical filter. A suitable technique for poling longitudinal and torsional wave filters is described in detail in my above-mentioned application Serial No. 351,841, filed at even date herewith. The applied silver paste electrodes can be given an added mass which may be used to give an adjustable feature to the frequency characteristic of the filter to compensate for any nonhomogenieties in the properties of the ceramics.

For any of the compositions specified, the results of measuring about 20 samples of each composition show that the properties repeat to at least one percent of the frequency and about five percent for the ratio of capacities. The one percent variation in frequency can be compensated for by abrading off a certain amount of the silver paste electrodes to increase the resonant frequency of propagation of sound in the main conducting rod of the filter. Removal of baked-on silver paste can also be used to adjust the resonant frequency of the cross bar or disc of the filter. Variations in the ratio of capacities of the ceramic can be taken account of by using the adjustable condensers on the ends of the driving sections.

When a barium titanate ceramic is allowed to age at room temperature for a period of a year, the dielectric and piezoelectric constants decrease while the value of Young's modulus and the mechanical figure of merit of the ceramic increase. The amount of aging depends to quite an extent on how much lead titanate is in the ceramic. Figs. 2, 3, 4, and 5 show respectively the changes in frequency, electromechanical coupling factor, dielectric constant, and figure of merit occurring for the compositions D and E plotted at intervals over nearly a years time. It is apparent from those curves that without the application of special aging techniques of the type described in detail hereinafter, normal aging occurs for the first six months, after which the properties remain fixed with time.

In accordance with the invention now disclosed and claimed in applicant's previously mentioned divisional application, Serial No. 733,679, filed May 7, 1958, so-called "pre-aging" techniques have been developed for aging the ceramics artifically such that the time intervals required to stabilize the properties of the poled ceramic elements are greatly reduced. It has been found that the temperature of the treated ceramic elements has to be kept lower than the Curie temperature since otherwise the realignment of domains would occur starting the aging cycle over again.

In accordance with the invention of my above-mentioned divisional application, it has been found that the best aging cycle is one in which the treated element is processed first at a relatively high temperature, followed by a treatment at a lower temperature. One method of accomplishing this, for example, is by aging the ceramic three days at 80° C. followed by three days at 50° C. This cycle results in an increase in the resonant frequency of 2.1 percent for composition E and 1.68 percent for composition D. The ensuing increase at room temperature is shown by Fig. 6, and amounts to less than .09 percent for composition E and less than 0.06 percent for composition D. Furthermore, most of the increase occurs in less than a week, so that a two weeks aging period is sufficient to take most of the time variations out of the frequency constant. The dielectric constant and piezoelectric constants do not age after the treatment as shown by the coupling curves of Fig. 7. The aged values for these two compositions are as follows:

| Composition D | Composition E |
| --- | --- |
| $Y_0=1.39\times10^{12}$ dynes/cm.$^2$<br>$d_{31}=66\times10^{-8}$<br>$\epsilon^T=500$<br>frequency constant$=2.49\times10^5$ cycles/cm. (longitudinal)<br>$k_l=.123$<br>$Q=1200$<br>$k_r=0.211$ | $Y_0=1.35\times10^{12}$ dynes/cm.$^2$<br>$d_{31}=52.5\times10^{-8}$<br>$\epsilon^T=412$<br>frequency constant$=2.46\times10^5$ cycles (longitudinal)<br>$k_l=.1065$<br>$Q=1200$<br>$k_r=0.181$ |

Summarizing the results of the tests performed, it is found that the best aging cycle is one which starts out at a high temperature maintained for a sufficient time to relax practically all the stress at that temperature, and which is then carried on at each of two lower temperatures to relax the additional stress generated by going from a warm temperature to a cooler temperature. If 110° C. is taken as the highest temperature for aging, one day's time will relax all but one part in 100,000 of the stress at that temperature. If the temperature is then reduced to 80° C. for three days, followed by a 50° C. anneal for three days, and a room temperature aging for one week, practically all the frequency, capacity, and coupling aging will disappear.

An additional technique involves, during aging, the application across each of the subject ceramics of a fixed potential of about half the magnitude, and in the same direction as the poling potential. This has the effect of increasing the permanent coupling coefficient by about ten percent.

The data herein presented shows that by using compositions consisting of the proper proportions of $PbTiO_3$, $CaTiO_3$, and $BaTiO_3$, and by using a proper aging cycle, ceramics can be obtained which are stable with teemperature and time. It will be apparent to those skilled in the art that ceramics of the disclosed compositions are suitable for a large number of applications, some of which will be discussed briefly hereinafter and several of which are discussed in detail in my above-mentioned application Serial No. 351,841 and also in application Serial No. 351,842, which is a joint application with H. J. McSkimin, both of which applications are filed at even date herewith. The joint application matured into Patent 2,774,042, granted December 11, 1956. It will be apparent from the variations in characteristics of the subject compositions that for each of these applications different ceramics may give the best results, since the requirements are different. Accordingly, an attempt will be made to discuss the various uses and to suggest the best ceramic composition for each.

When a ceramic comprising barium titanate is used to measure forces, or pressures in a liquid, it is desirable to have a material characterized by a high ratio of the $d_{31}$ constant to the dielectric constant $\epsilon^T$. From the data of the following tables, it appears that composition B will give about 25 percent higher response than titanate compositions previously used for this purpose, and will give a more constant output over a wider temperature range.

When ceramics are to be used in filters and delay lines, the requisite properties are high figures of merit, high temperature stability, and high time stability. As shown hereinbefore, compositions which are particularly adaptable for such usage are compositions D and E previously discussed. The latter composition, E has the higher electromechanical coupling factor, while the former, D has the flatter temperature frequency curve. These ceramics have figures of merit of from 1200 to 1500, which are sufficient to give very selective filters. After being properly preaged, their time and temperature stabilities are of the same order as can be obtained with a −18° X-cut quartz crystal, a type largely used in selective filters. Hence, these ceramics can be considered for a direct replacement of quartz in crystal filters. Since they can be molded to size, and adjusted by evaporation of plating on the surface, they should provide a less expensive element than the latter.

Figure 8:
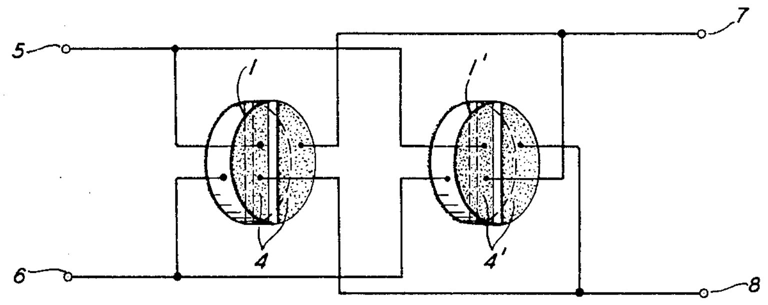
Fig. 8 shows a torsional mechanical filter, which may comprise one of the subject compositions; useful for rural carrier systems.

A very simple filter for a rural carrier system such as disclosed and described in detail in my above-mentioned application Serial No. 351,841, is made from a pair of ceramic discs 1 and 1′ shown in Fig. 8 of the drawings. The discs 1, 1′, prepared in the manner previously described, have their opposing major surfaces nearly completely coated with evaporated or baked-on metallic electrodes 4, 4′. On each of the four surfaces these take the form of a pair of semi-discs spaced apart along the diameter. The semi-disc electrodes are aligned in identical manner on opposite faces of each of the ceramic discs, as shown. For the purposes of poling the ceramic, the electrodes on one side are connected together to the positive side of the poling battery (not shown), while the electrodes on the opposite side are connected together to the negative side thereof. After poling, the electrodes on disc 1′ are connected with one half of the element between input terminal 5 and output terminal 8, and the other half between input terminal 6 and output terminal 7. The electrodes on disc 1 are connected with one half of the element between the input terminal 5 and output terminal 7, and the other half between input terminal 6 and output terminal 8. Such a structure has a pass band of 8000 cycles at 250,000 cycles, and an attenuation peak on either side of the band and is characterized by an impedance of about 2000 ohms.

Figure 9:
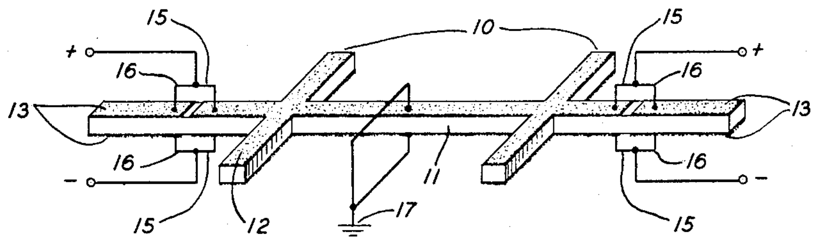
Fig. 9 shows a one-piece longitudinal mechanical filter which may comprise one of the subject ceramics, one end of which is poled to act as a driving transducer, and the other end of which is poled to act as a receiving transducer.

Such ceramics can also be used in a one piece electromechanical filter as illustrated, by way of example, in Fig. 9 of the drawings, in which the attenuation is determined by cross bars 10 on a main conducting rod 11 of rectangular cross section. The upper and lower major faces are coated over nearly the entire portion, including the crossbars, with evaporated or baked-on electrodes 12. At the two ends of the main rod, on both the upper and lower surfaces, the continuity of the electrode coating is broken to form separate electrodes 13. For poling purposes, leads 15 and 16 serve to connect together all of the electrodes on the upper surface to the positive side of the poling battery, and all of the electrodes on the lower surface to the negative side of the poling battery. After poling, connections 15 are removed, and leads 16 make direct connections in pairs to the electrodes 13, in such a manner that one end of the rod acts as the driving transducer and the other end acts as the receiving transducer. After poling the electrodes 12 plated on the upper and lower surfaces of the central portions of the rod are connected together and to ground 17, as shown.

Such ceramics can also be used in delay lines of the types disclosed in the prior art as adapted to the use of ferroelectric materials.

Tables III through XII which follow give various characteristics of the compositions B, C, D, E, F and G, of the invention. Table II presents the corresponding characteristics of commercial barium titanate, designated composition A, for purposes of comparison.

*Table II*

COMPOSITION A.—COMMERCIAL BARIUM TITANATE

| Temp., ° C. | Freq. constant ($f_Ra$) | Young's modulus $Y_0$, dynes/cm.² | $k_r$ | $k_l$ | $\epsilon^T$ | $d^{31}$ | Q |
|---|---|---|---|---|---|---|---|
| −40 | $1.57 \times 10^5$ | $1.19 \times 10^{12}$ | .215 | .127 | 700 | $86.5 \times 10^{-8}$ | ---- |
| −30 | 1.53 | 1.14 | .23 | .136 | 700 | 95.4 | ---- |
| −20 | 1.51 | 1.11 | .245 | .145 | 750 | 106 | ---- |
| −10 | 1.46 | 1.04 | .28 | .166 | 1,100 | 152 | ---- |
| 0 | 1.40 | 0.955 | .33 | .195 | 1,525 | 220 $\times 10^{-8}$ | ---- |
| +10 | 1.475 | 1.06 | .30 | .178 | 1,510 | 190 | ---- |
| +20 | 1.53 | 1.14 | .285 | .169 | 1,500 | 168 | 150 |
| +30 | 1.56 | 1.185 | .275 | .163 | 1,500 | 164 | ---- |
| +40 | 1.575 | 1.21 | .265 | .157 | 1,520 | 157 | ---- |
| +50 | 1.59 | 1.23 | .261 | .154 | 1,550 | 156 | ---- |
| +60 | 1.60 | 1.24 | .25 | .148 | 1,600 | 150 | ---- |
| +70 | 1.605 | 1.25 | .254 | .151 | 1,650 | 155 | ---- |
| +80 | 1.61 | 1.26 | .258 | .153 | 1,700 | 159 | ---- |

*Table III*

COMPOSITION B.—4% $PbTiO_3$, 5.7% $CaTiO_3$, 90.3% $BaTiO_3$

| Temp., ° C. | Freq. constant ($f_Ra$) | Young's modulus $Y_0$, dynes/cm.² | $k_r$ | $k_l$ | $\epsilon^T$ | $d_{31}$ | Q |
|---|---|---|---|---|---|---|---|
| −45 | $1.499 \times 10^5$ | $1.092 \times 10^{12}$ | .341 | .202 | 1,080 | $174 \times 10^{-8}$ | 262 |
| −40 | 1.509 | 1.11 | .343 | .203 | 989 | 171 | 281 |
| −30 | 1.527 | 1.135 | .334 | .198 | 942 | 161 | 324 |
| −25 | 1.532 | 1.145 | .33 | .195 | 920 | 152 | 333 |
| −20 | 1.548 | 1.172 | .316 | .188 | 887 | 146 | 353 |
| −10 | 1.56 | 1.185 | .314 | .186 | 855 | 143 | 331 |
| 0 | 1.569 | 1.20 | .3065 | .182 | 800 | 135 | 338 |
| +15 | 1.58 | 1.22 | .302 | .179 | 797 | 129 | 380 |
| +26 | 1.595 | 1.24 | .28 | .166 | 783 | 118 | 383 |
| +30 | 1.595 | 1.24 | .2775 | .164 | 786 | 117 | 370 |
| +40 | 1.595 | 1.24 | .2755 | .163 | 795 | 116 | 353 |
| +50 | 1.596 | 1.24 | .271 | .161 | 798 | 115 | 311 |
| +60 | 1.598 | 1.245 | .265 | .157 | 820 | 114 | 355 |
| +70 | 1.598 | 1.245 | .261 | .154 | 845 | 113 | 304 |
| +80 | 1.596 | 1.241 | .256 | .152 | 874 | 114 | 268 |
| +90 | 1.592 | 1.238 | .245 | .143 | 1,050 | 117 | 217 |

*Table IV*

COMPOSITION C.—8% $PbTiO_3$, 5.4% $CaTiO_3$, 86.6% $BaTiO_3$

| Temp., ° C. | Freq. constant ($f_Ra$) | Young's modulus $Y_0$ | $k_r$ | $k_l$ | $\epsilon^T$ | $d_{31}$ | Q |
|---|---|---|---|---|---|---|---|
| −45 | $1.559 \times 10^5$ | $1.182 \times 10^{12}$ | .303 | .179 | 767 | $129 \times 10^{-8}$ | 360 |
| −40 | 1.562 | 1.19 | .301 | .178 | 767 | 127 | 323 |
| −30 | 1.569 | 1.196 | .295 | .174 | 734 | 121 | 371 |
| −25 | 1.572 | 1.205 | .292 | .173 | 724 | 120 | 410 |
| −20 | 1.584 | 1.22 | .290 | .171 | 707 | 116 | 444 |
| −10 | 1.585 | 1.222 | .288 | .1705 | 686 | 114 | 425 |
| 0 | 1.59 | 1.232 | .283 | .1672 | 675 | 110 | 416 |
| +15 | 1.60 | 1.248 | .267 | .158 | 665 | 103 | 482 |
| +20 | 1.609 | 1.26 | .255 | .151 | 655 | 97 | 465 |
| +30 | 1.609 | 1.26 | .252 | .149 | 663 | 96.4 | 429 |
| +40 | 1.61 | 1.262 | .248 | .147 | 670 | 96 | 397 |
| +50 | 1.609 | 1.26 | .243 | .144 | 681 | 94.5 | 372 |
| +60 | 1.608 | 1.258 | .238 | .141 | 705 | 94.5 | 360 |
| +70 | 1.607 | 1.257 | .233 | .138 | 726 | 93.8 | 348 |
| +80 | 1.606 | 1.256 | .227 | .134 | 764 | 93.5 | 314 |
| +90 | 1.602 | 1.256 | .208 | .123 | 879 | 91 | 310 |

*Table V*

COMPOSITION D.—12% $PbTiO_3$, 8.2% $CaTiO_3$, 79.8% $BaTiO_3$

| Temp., ° C. | Freq. constant ($f_Ra$) | Young's modulus $Y_0$ | $k_r$ | $k_l$ | $\epsilon^T$ | $d_{31}$ | Q |
|---|---|---|---|---|---|---|---|
| −40 | $1.605 \times 10^5$ | $1.271 \times 10^{12}$ | .231 | .137 | 458 | $73.5 \times 10^{-8}$ | 624 |
| −30 | 1.6079 | 1.273 | .224 | .1322 | 447 | 70.1 | 698 |
| −20 | 1.6099 | 1.275 | .223 | .132 | 447 | 69.6 | 720 |
| −10 | 1.6127 | 1.279 | .217 | .1282 | 447 | 67.6 | 783 |
| 0 | 1.6137 | 1.282 | .213 | .126 | 454 | 67 | 723 |
| +15 | 1.6155 | 1.284 | .207 | .1225 | 454 | 65 | 715 |
| +25 | 1.6155 | 1.284 | .204 | .121 | 462 | 64.5 | 700 |
| +30 | 1.6150 | 1.283 | .202 | .120 | 469 | 64.5 | 710 |
| +35 | 1.6149 | 1.281 | .201 | .119 | 476 | 64.8 | 676 |
| +40 | 1.6141 | 1.280 | .201 | .119 | 482 | 65.2 | 670 |
| +50 | 1.6126 | 1.279 | .198 | .117 | 491 | 64.8 | 653 |
| +60 | 1.6094 | 1.275 | .194 | .115 | 510 | 64.8 | 540 |
| +70 | 1.6075 | 1.273 | .185 | .109 | 535 | 64.0 | 600 |
| +80 | 1.6033 | 1.273 | .179 | .106 | 565 | 63.5 | 575 |
| +90 | 1.6011 | 1.273 | .173 | .1025 | 598 | 62.7 | 543 |
| +100 | 1.5997 | 1.271 | .159 | .0941 | 650 | 60 | 610 |
| +110 | 1.5938 | 1.27 | .1425 | .0844 | 769 | 58.5 | 601 |

*Table VI*

COMPOSITION E.—8% $PbTiO_3$, 8.6% $CaTiO_3$, 83.4% $BaTiO_3$

| Temp., ° C. | Freq. constant ($f_Ra$) | Young's modulus $Y_0$ | $k_r$ | $k_l$ | $\epsilon^T$ | $d_{31}$ | Q |
|---|---|---|---|---|---|---|---|
| −40 | 1.6194 | $1.278 \times 10^{12}$ | .273 | .162 | 569 | $96.5 \times 10^{-8}$ | 555 |
| −30 | 1.6245 | 1.287 | .264 | .1561 | 557 | 91.5 | 535 |
| −20 | 1.6281 | 1.294 | .262 | .155 | 554 | 90.5 | 525 |
| −10 | 1.6327 | 1.30 | .257 | .152 | 550 | 88.4 | 555 |
| 0 | 1.6348 | 1.302 | .2505 | .1485 | 554 | 86.5 | 555 |
| +15 | 1.6387 | 1.307 | .2425 | .1432 | 554 | 83.5 | 555 |
| +25 | 1.640 | 1.311 | .239 | .1415 | 557 | 82.4 | 555 |
| +30 | 1.639 | 1.309 | .238 | .1409 | 560 | 82.2 | 595 |
| +35 | 1.6386 | 1.308 | .237 | .1402 | 572 | 82.9 | 515 |
| +40 | 1.6381 | 1.307 | .233 | .138 | 580 | 82.0 | 537 |
| +50 | 1.6367 | 1.305 | .23 | .136 | 598 | 82.0 | 526 |
| +60 | 1.6349 | 1.302 | .225 | .133 | 625 | 82.2 | 565 |
| +70 | 1.6310 | 1.298 | .222 | .131 | 665 | 83.5 | 545 |
| +80 | 1.628 | 1.29 | .213 | .126 | 725 | 84.1 | 495 |
| +90 | 1.624 | 1.286 | .202 | .119 | 794 | 83.5 | 460 |
| +100 | 1.621 | 1.281 | .182 | .108 | 898 | 84.5 | 545 |
| +110 | 1.611 | 1.265 | .164 | .097 | 1,235 | 85.5 | 440 |

*Table VII*

COMPOSITION F.—8% $PbTiO_3$, 2.7% $CaTiO_3$, 89.3% $BaTiO_3$

| Temp., ° C. | Freq. constant ($f_Ra$) | Young's modulus $Y_0$, dynes/cm.² | $k_r$ | $k_l$ | $\epsilon^T$ | $d_{31}$ | Q |
|---|---|---|---|---|---|---|---|
| −45 | $1.443 \times 10^5$ | $1.015 \times 10^{12}$ | .338 | .2 | 1,072 | $184 \times 10^{-8}$ | 206 |
| −40 | 1.453 | 1.03 | .325 | .192 | 1,035 | 171 | 272 |
| −30 | 1.481 | 1.07 | .317 | .188 | 985 | 161 | 328 |
| −25 | 1.492 | 1.085 | .310 | .183 | 953 | 153 | 399 |
| −20 | 1.509 | 1.11 | .303 | .1795 | 906 | 144 | 381 |
| −10 | 1.524 | 1.132 | .295 | .175 | 860 | 136 | 385 |
| 0 | 1.538 | 1.151 | .289 | .171 | 821 | 129 | 356 |
| +15 | 1.555 | 1.18 | .27 | .16 | 769 | 115 | 434 |
| +26 | 1.562 | 1.19 | .264 | .156 | 732 | 109 | 404 |
| +30 | 1.567 | 1.195 | .265 | .157 | 732 | 110 | 373 |
| +40 | 1.569 | 1.197 | .261 | .1545 | 726 | 107 | 334 |
| +50 | 1.57 | 1.202 | .252 | .149 | 726 | 103 | 296 |
| +60 | 1.572 | 1.207 | .248 | .147 | 737 | 103 | 243 |
| +70 | 1.573 | 1.21 | .244 | .144 | 744 | 101 | 249 |
| +80 | 1.573 | 1.21 | .237 | .14 | 765 | 99.5 | 226 |
| +90 | 1.57 | 1.202 | .231 | .137 | 816 | 101 | 197 |

*Table VIII*

COMPOSITION G.—12% $PbTiO_3$, 5.4% $CaTiO_3$, 82.6% $BaTiO_3$

| Temp., ° C. | Freq. constant ($f_Ra$) | Young's modulus $Y_0$ | $k_r$ | $k_l$ | $\epsilon^T$ | $d_{31}$ | Q |
|---|---|---|---|---|---|---|---|
| −40 | $1.549 \times 10^5$ | $1.17 \times 10^{12}$ | .238 | .141 | 550 | $86 \times 10^{-8}$ | 540 |
| −30 | $1.555 \times 10^5$ | 1.18 | .2325 | .138 | 531 | 82.5 | 565 |
| −20 | 1.5597 | 1.185 | .226 | .134 | 520 | 79 | 550 |
| −10 | 1.5628 | 1.19 | .222 | .131 | 516 | 77 | 575 |
| 0 | 1.5654 | 1.192 | .2195 | .130 | 513 | 76 | 540 |
| +15 | 1.5696 | 1.202 | .2115 | .126 | 505 | 73 | 565 |
| +25 | 1.5708 | 1.202 | .207 | .122 | 505 | 70.5 | 520 |
| +30 | 1.5706 | 1.202 | .205 | .121 | 509 | 71.5 | 480 |
| +35 | 1.5704 | 1.202 | .203 | .120 | 516 | 70.5 | 450 |
| +40 | 1.5698 | 1.202 | .199 | .118 | 520 | 69.5 | 455 |
| +50 | 1.5671 | 1.199 | .198 | .117 | 531 | 69.5 | 442 |
| +60 | 1.5679 | 1.197 | .193 | .114 | 542 | 68.5 | 415 |
| +70 | 1.5660 | 1.193 | .189 | .112 | 562 | 68.5 | 400 |
| +80 | 1.5632 | 1.191 | .184 | .109 | 590 | 68.5 | 360 |
| +90 | 1.5600 | 1.187 | .175 | .104 | 616 | 67 | 310 |
| +100 | 1.5569 | 1.185 | .172 | .102 | 656 | 68.5 | 290 |
| +110 | 1.552 | 1.175 | .159 | .094 | 755 | 67.5 | ---- |

*Table IX*

Properties of 8% $PbTiO_3$, 8.6% $CaTio_3$, 83.4% $BaTiO_3$ (composition E) poled at 70° C. with 41.5 volts per .001 inch for 4 hours:

| Days' aging | Freq. constant ($f_Ra$) | Young's modulus $Y_0$ | $k_r$ | $k_l$ | $\epsilon^T$ | $d_{31}$ | Q |
|---|---|---|---|---|---|---|---|
| | *Kc.* | | | | | | |
| 0 | 164.1 | $1.312\times10^{12}$ | .213 | .126 | 587 | $75.4\times10^{-8}$ | 572 |
| 5 | 164.3 | 1.315 | .207 | .122 | 586 | 72.7 | 637 |
| 11 | 164.5 | 1.318 | .2035 | .12 | 582 | 71.2 | 705 |
| 17 | 164.8 | 1.322 | .2015 | .119 | 574 | 70.1 | 760 |
| 24 | 165.2 | 1.328 | .20 | .118 | 567 | 69 | 795 |
| 35 | 165.4 | 1.332 | .198 | .117 | 562 | 68 | 805 |
| 48 | 165.6 | 1.335 | .197 | .116 | 552 | 66.5 | 970 |

*Table X*

Properties of 12% $PbTiO_3$, 8.2% $CaTiO_3$, 79.8% $BaTiO_3$ (composition D) poled at 70° C. with 41.5 volts per .001 inch for 4 hours:

| Days' aging | Freq. constant ($f_Ra$) | Young's modulus $Y_0$ | $k_r$ | $k_l$ | $\epsilon^T$ | $d_{31}$ | Q |
|---|---|---|---|---|---|---|---|
| | *Kc.* | | | | | | |
| 0 | 162.2 | $1.282\times10^{-12}$ | .1615 | .0956 | 490 | $52.6\times10^{-8}$ | 667 |
| 5 | 162.5 | 1.288 | .1586 | .0939 | 490 | 51.2 | 735 |
| 11 | 162.7 | 1.289 | .153 | .0906 | 484 | 49.5 | 842 |
| 17 | 162.8 | 1.29 | .156 | .0924 | 477 | 50 | 767 |
| 19 | 162.9 | 1.292 | .155 | .0918 | 475 | 49.6 | 870 |
| 25 | 163.0 | 1.294 | .153 | .0906 | 475 | 49 | 840 |
| 35 | 163.0 | 1.294 | .154 | .0912 | 473 | 49.2 | 870 |
| 48 | 163.1 | 1.296 | .154 | .0912 | 458 | 48.5 | 962 |

*Table XI*

Properties of 12% $PbTiO_3$, 8.2% $CaTiO_3$, 79.8% $BaTiO_3$ (composition D) poled at 140° C. with 31 volts per .001 inch. Ceramic heated to 70° C. for hours shown below. Aged at room temperature for days shown below:

| | ($f_Ra$) | $Y_0$ dynes/cm.$^2$ | $k_r$ | $k_l$ | $\epsilon^T$ | $d_{31}$ | Q |
|---|---|---|---|---|---|---|---|
| Time, hours at 70° C.: | *Kc.* | | | | | | |
| 0 | 163.5 | $1.30\times10^{12}$ | .218 | .129 | 457 | $68.4\times10^{-8}$ | 559 |
| 19 | 165.3 | 1.331 | .193 | .114 | 432 | 58 | 760 |
| 43 | 165.7 | 1.338 | .1875 | .111 | 420 | 55.6 | 885 |
| 115 | 166.0 | 1.343 | .186 | .11 | 412 | 54.4 | 1,060 |
| Days at 25° C.: | | | | | | | |
| 1 | 166.3 | 1.348 | .18 | .1065 | 414 | 52.5 | 1,180 |
| 2 | 166.4 | 1.35 | .18 | .1065 | 412 | 52.5 | 1,170 |
| 4 | 166.5 | 1.351 | .18 | .1065 | 412 | 52.5 | 1,210 |
| 7 | 166.6 | 1.352 | .18 | .1065 | 412 | 52.5 | 1,200 |
| 14 | 166.6 | 1.352 | .18 | .1065 | 412 | 52.5 | 1,250 |
| 23 | 166.6 | 1.352 | .18 | .1065 | 412 | 52.5 | 1,250 |

*Table XII*

Properties of 8% $PbTiO_3$, 8.6% $CaTiO_3$, 83.4% $BaTiO_3$ (composition E) poled at 140° C. with 31 volts per .001 inch. Ceramic heated to 70° for hours shown below. Aged at room temperature for days shown below:

| | ($f_Ra$) | $Y_0$ dynes/cm.$^2$ | $k_r$ | $k_l$ | $\epsilon^T$ | $d_{31}$ | Q |
|---|---|---|---|---|---|---|---|
| Time, hours at 70° C.: | *Kc.* | | | | | | |
| 0 | 165 | $1.325\times10^{12}$ | .254 | .1505 | 577 | $88.7\times10^{-12}$ | 578 |
| 19 | 167.2 | 1.362 | .224 | .1325 | 524 | 73.5 | 765 |
| 43 | 167.9 | 1.371 | .216 | .128 | 510 | 69.7 | 905 |
| 115 | 168.4 | 1.382 | .212 | .1255 | 504 | 67.5 | 1,010 |
| Days at 25° C.: | | | | | | | |
| 1 | 168.8 | 1.385 | .21 | .1242 | 500 | 66.7 | 1,100 |
| 2 | 168.9 | 1.386 | .21 | .1242 | 500 | 66.7 | 1,110 |
| 4 | 169.0 | 1.389 | .21 | .1242 | 500 | 66.6 | 1,150 |
| 7 | 169.0 | 1.390 | .209 | .1238 | 500 | 66.3 | 1,170 |
| 14 | 169.0 | 1.39 | .208 | .1232 | 500 | 66.0 | 1,200 |
| 23 | 169.0 | 1.39 | .208 | .1232 | 500 | 66.0 | 1,200 |

It is to be understood that the above-described arrangements are illustrative of the application of the principles of the invention. Numerous other arrangements may be devised by those skilled in the art without departing from the spirit and scope of the invention.

What is claimed is:

1. An electromechanical filter element having a resonant frequency-temperature variation of less than one-tenth of one percent throughout the entire range of 55 to 110° F., inclusive, said element comprising a ceramic consisting of barium titanate with additives of substantially 8 to 12 percent by weight of lead titanate and between 8 to 8.6 percent by weight of calcium titanate, and a pair of conductive electrodes affixed to a pair of oppositely disposed major surfaces, respectively, of said element.

2. An electromechanical transducer comprising in combination a dielectric element, electrode means coupled to said element, and polarizing terminals connected to said electrode means, wherein said element has a composition consisting of barium titanate as its principal component with additives of substantially 4 to 12 percent by weight of lead titanate and substantially 5.4 to 8.6 percent by weight of calcium titanate.

3. An electromechanical transducer comprising in combination a dielectric element, electrode means coupled to said element, and polarizing terminals connected to said electrode means, wherein said element has a composition consisting of substantially 8 percent $PbTiO_3$, 8.6 percent of $CaTiO_3$, and 83.4 percent of $BaTiO_3$, all by weight.

4. An electromechanical transducer comprising in combination a dielectric element, electrode means coupled to said element, and polarizing terminals connected to said electrode means, wherein said element has a composition of substantially 12 percent $PbTiO_3$, 8 percent of $CaTiO_3$, and 80 percent of $BaTiO_3$, all by weight.

5. An electromechanical transducer comprising in combination a dielectric element, electrode means coupled to said element, and polarizing terminals connected to said electrode means, wherein said element has a composition consisting of substantially 4 percent of $PbTiO_3$, 6 percent of $CaTiO_3$, and 90 percent of $BaTiO_3$, all by weight.

6. An electromechanical transducer comprising in combination a dielectric element, electrode means coupled to said element, and polarizing terminals connected to said electrode means, wherein said element has a composition consisting of substantially 8 percent of $PbTiO_3$, 5 percent of $CaTiO_3$, and 87 percent $BaTiO_3$ all by weight.

7. An electromechanical transducer comprising in combination a dielectric element, electrode means coupled to said element, and polarizing terminals connected to said electrode means, wherein said element has a composition consisting of substantially 12 percent of $PbTiO_3$, 5 percent of $CaTiO_3$, and 83 percent of $BaTiO$, all by weight.

References Cited in the file of this patent

UNITED STATES PATENTS

| | | |
|---|---|---|
| 2,399,082 | Wainer | Apr. 23, 1946 |
| 2,402,515 | Wainer | June 18, 1946 |
| 2,467,169 | Wainer | Apr. 12, 1949 |
| 2,538,554 | Cherry | Jan. 16, 1951 |
| 2,540,412 | Adler | Feb. 6, 1954 |
| 2,614,144 | Howatt | Oct. 14, 1952 |
| 2,616,989 | Hepp | Nov. 4, 1952 |
| 2,742,370 | Wainer | Apr. 17, 1956 |

FOREIGN PATENTS

| | | |
|---|---|---|
| 574,577 | Great Britain | Jan. 11, 1946 |